United States Patent [19]

Kelly

[11] 4,137,097
[45] Jan. 30, 1979

[54] SOLAR ENERGY ASSEMBLY

[76] Inventor: Joseph E. Kelly, 508 Island St., LaCrosse, Wis. 54601

[21] Appl. No.: 824,428

[22] Filed: Aug. 15, 1977

[51] Int. Cl.$^2$ .......................... H01L 31/04; F24J 3/02
[52] U.S. Cl. .......................... 136/89 PC; 136/89 HY; 126/270; 126/271
[58] Field of Search .................. 136/89 PC, 89 HY; 126/270, 271

[56] References Cited

U.S. PATENT DOCUMENTS

| 2,989,575 | 6/1961 | Wallace, Jr. | 136/89 |
| 3,866,285 | 2/1975 | Clark | 29/157 R |
| 4,080,221 | 3/1978 | Manelas | 136/89 PC |

Primary Examiner—John H. Mack
Assistant Examiner—Aaron Weisstuch
Attorney, Agent, or Firm—Frank R. Thienpont

[57] ABSTRACT

A solar energy collector and heat exchanger assembly comprising a housing having a transparent top, a transparent wall within the housing parallel to the top to divide the housing into upper and lower chambers, the upper chamber having an air inlet and an air outlet, the lower chamber having a liquid inlet interconnected by a conduit to a liquid outlet, photo cells disposed in the lower chamber and adapted to provide heat to the conduit, and reflector structure disposed in the lower chamber for directing sunlight to the photo cells and for reflecting sunlight to the upper chamber.

10 Claims, 2 Drawing Figures

SOLAR ENERGY ASSEMBLY

BACKGROUND OF THE INVENTION

1. Field of the Invention

This invention relates to energy generating devices and is directed more particularly to a solar energy assembly.

2. Description of the Prior Art

Current concern over the depletion of fossil fuels has intensified public interest in providing alternative energy sources. Solar energy has long been recognized as being one of the most promising sources of energy for the future. In the past a great variety of proposals have been offered for harnessing this virtually limitless and nonpolluting energy source.

Examples of such proposals may be found in U.S. Pat. Nos. 695,136, issued Mar. 11, 1902 to M. M. Baker; 3,194,228, issued July 13, 1965 to M. A. Bargues; 3,321,012, issued May 23, 1967 to D. E. Hervey; 3,951,129, issued Apr. 20, 1976 to L. W. Brantley, Jr.; 3,964,464, issued June 22, 1976 to V. J. Hockman; 3,965,887, issued June 29, 1976 to E. J. Gramer; and 3,976,508, issued Aug. 24, 1976 to A. I. Mlavsky.

Even after the above advances, there still exists a need for a relatively inexpensive and non-complex assembly for collecting solar energy and exchanging heat therefrom for useful purposes.

SUMMARY OF THE INVENTION

An object of the present invention is to provide a relatively non-complex and inexpensive assembly for collecting solar energy and exchanging heat therefrom for useful purposes.

With the above and other objects in view, as will hereinafter appear, a feature of the present invention is the provision of a solar energy collector and heat exchanger assembly comprising a housing having a bottom wall and upstanding side walls, a transparent top disposed on the housing, a transparent wall disposed in the housing in a plane parallel to the plane of the top, the transparent wall being about its entire periphery adjacent inner surfaces of the upstanding side walls, whereby to divide the housing into upper and lower chambers, the upper chamber having an air inlet and an air outlet, the lower chamber having a liquid inlet and a liquid outlet interconnected by a conduit extending through the lower chamber, photo cells disposed in the lower chamber and adapted to provide heat to the conduit, and reflective means disposed in the lower chamber for directing sunlight to the photo cells and for reflecting sunlight toward the upper chamber.

The above and other features of the invention, including various novel details of construction and combinations of parts, will now be more particularly described with reference to the accompanying drawings and pointed out in the claims. It will be understood that the particular device embodying the invention is shown by way of illustration only and not as a limitation of the invention. The principles and features of this invention may be employed in various and numerous embodiments without departing from the scope of the invention.

DESCRIPTION OF THE DRAWINGS

Reference is made to the accompanying drawings in which is shown an illustrative embodiment of the invention from which its novel features and advantages will be apparent.

DESCRIPTION OF THE PREFERRED EMBODIMENT

Figure 1:
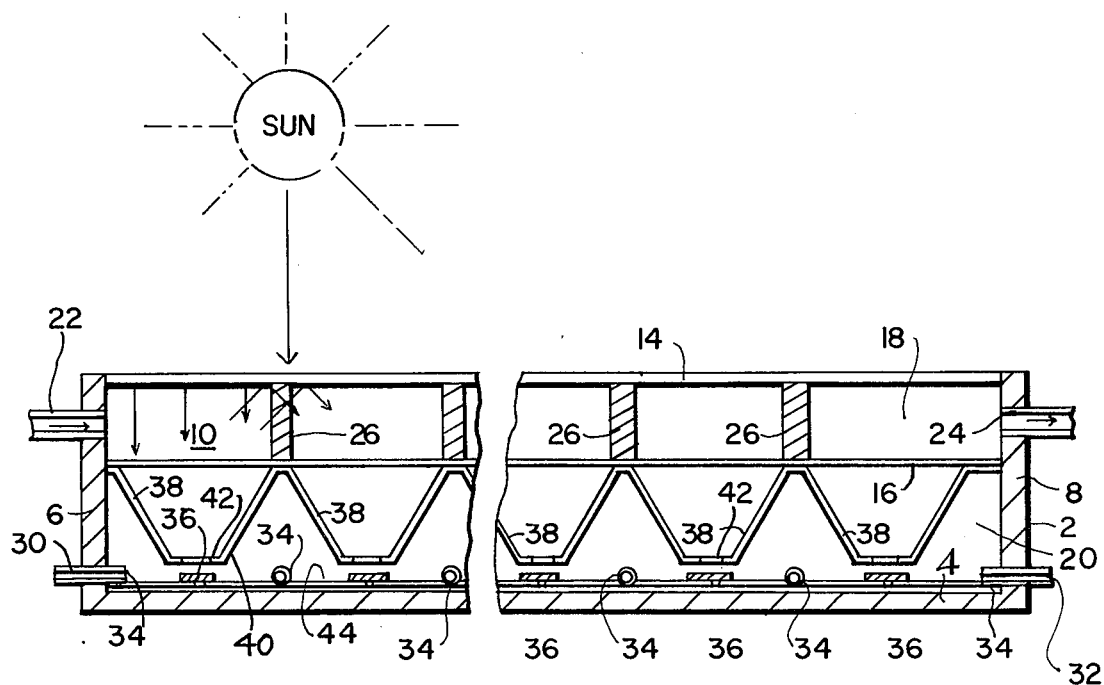
FIG. 1 is a sectional view of one form of assembly illustrative of an embodiment of the invention.
Figure 2:
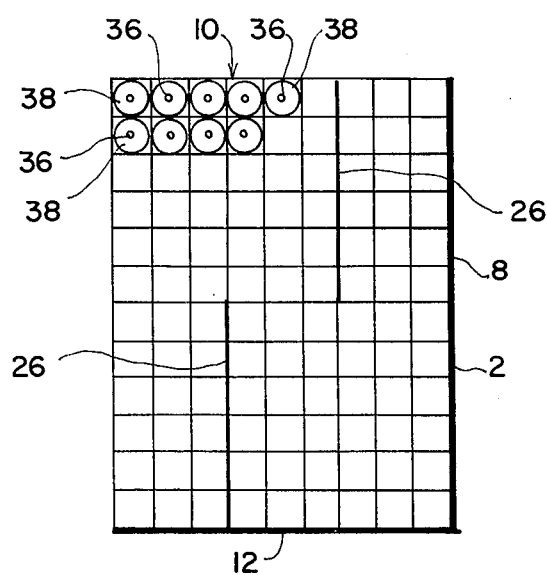
FIG. 2 is a diagrammatic plan view thereof.

Referring to the drawings, it will be seen that the illustrative assembly includes a housing 2 having a bottom wall 4 and upstanding side walls 6, 8, 10, and 12. A transparent top 14, preferably of acrylic plastic, is disposed on the housing 2. A transparent wall 16, preferably of clear fibreglass, is disposed in the housing 2 in a plane parallel to the plane of the top 14. The wall 16 is further disposed about its entire periphery adjacent inner surfaces of the side walls 6, 8, 10, 12, to divide the housing into upper and lower chambers 18, 20.

The upper chamber 18 is provided with an air inlet 22 and an air outlet 24 disposed respectively on opposite sides 6, 8 of the housing 2. The upper chamber is further provided with a series of staggered barriers 26 disposed transversely between the air inlet 22 and air outlet 24. The barriers 26 comprise a series of rigid bars connected at an upper edge to the top 14 and at a lower edge to the wall 16, and having a first end connected to an inside surface of an upstanding side wall 10 and a second end disposed nearer to but removed from an inside surface of the opposite wall 12. The barriers 26 thereby cause air from the air inlet 22 to travel through a plurality of transverse paths before reaching the air outlet 24. Such back and forth movement of the air as it winds its way through the upper chamber 18 ensures that the air is subjected to the sun's rays passing through the top 14 for as long a period as practicable, depending upon the rate of flow of the air.

The lower chamber 20 is provided with a liquid inlet 30 and a liquid outlet 32 interconnected by a conduit 34 extending through the lower chamber 20. Photo cells 36 are disposed in the lower chamber 20 and are adapted to provide heat to the conduit 34, as will be further described below. The lower chamber 20 is further provided with reflective means 38 arranged for directing sunlight to the photo cells 36 and also for reflecting sunlight toward the upper chamber 18, as will be further described hereinafter.

The reflective means 38 preferably comprises a plurality of frusto-conically shaped cups 40, each having a central aperture 42 therein in alignment with a photo cell 36. In the preferred embodiment, the cups 40 are interconnected to form a unitary tray, the tray being connected to the wall 16 and to the side walls, as shown in FIG. 1. The upper surface of the cups 40 are provided with a coating of highly reflective material to enhance their reflective capabilities.

The botom wall 4 has attached thereto on the upper surface thereof a layer of absorptive material 44 on which is disposed the conduit 34 and the photo cells 36. Thus, rays from the sun are reflected by the upper walls of the reflective means 38 through the apertures 42 to the photo cells 36 which are heated by the sun and which in turn heat the absorptive material 44 which in turn provides heat to the conduit 34 and the liquid flowing therein.

In use, the air inlet 22 may be connected to a hot air heating system of a household so as to receive air from the "cold" side thereof. Such air is directed through the upper chamber 18 crossing back and forth in the chamber subject to the sun's rays passing through the top 14. Upon reaching the air outlet 24 the heated air is discharged into the "hot" side of the household air heating system.

Simultaneously with the operation of the upper chamber 18 a liquid, such as water, is introduced in the lower chamber by way of the liquid inlet 30 to flow through the conduit 34, the conduit crossing back and forth in the lower chamber 20 so as to receive the benefit of heat from a great multiplicity of photo cells 36 and the absorptive material 44. The water or other liquid is then exited through the liquid outlet 32 into a hot water system of a household or, if another liquid is used, to an appropriate heat exchanger downstream.

Thus, there is provided a solar energy collector and heat exchanger which operates to heat two mediums simultaneously for the benefit of a household or other structure.

It is to be understood that the present invention is by no means limited to the particular construction herein disclosed and/or shown in the drawings, but also comprises any modifications or equivalents within the scope of the disclosure.

Having thus described my invention what I claim as new and desire to secure by Letters Patent of the United States is:

1. A solar energy collector and heat exchanger assembly comprising a housing having a bottom wall and upstanding side walls, a transparent top disposed on said housing, a transparent wall disposed in said housing in a plane parallel to the plane of said top, said transparent wall being about its entire periphery adjacent inner surfaces of said upstanding side walls, whereby to divide said housing into upper and lower chambers, said upper chamber having an air inlet and an air outlet, said lower chamber having a liquid inlet and a liquid outlet interconnected by a conduit extending through said lower chamber, photo cells disposed in said lower chamber and adapted to provide heat to said conduit, and reflective means disposed in said lower chamber for directing sunlight to said photo cells and for reflecting sunlight toward said upper chamber.

2. The invention according to claim 1 including barrier means disposed in said upper chamber in transverse staggered relation and operative to cause air from said air inlet to move through a plurality of transverse paths before reaching said air outlet.

3. The invention according to claim 2 in which said barrier means comprises a series of rigid bars connected at an upper edge to said top and at a lower edge to said transparent wall, and having a first end connected to an inside surface of a first of said upstanding side walls, and a second end disposed nearer to but removed from an inside surface of a second of said upstanding side walls.

4. The invention according to claim 1 in which said reflective means comprises a plurality of frusto-conically shaped cups each having a central aperture therein, said aperture being in alignment with one of said photo cells.

5. The invention according to claim 4 in which said cups are interconnected to form a unitary tray, said tray being connected to said transparent wall and being connected to said side walls.

6. The invention according to claim 1 in which said top is of acrylic plastic and said transparent wall is of substantially clear fibreglass.

7. The invention according to claim 5 in which an upper surface of said tray is provided with a coating of highly reflective material.

8. The invention according to claim 1 in which said bottom wall has attached thereto on an upper surface thereof a layer of absorptive material.

9. The invention according to claim 8 in which said conduit is disposed on said absorptive material.

10. The invention according to claim 8 in which said photo cells are disposed on said absorptive material and provide heat to said absorptive material which in turn provides heat to said conduit.

* * * * *